(12) United States Patent
Ge et al.

(10) Patent No.: US 10,903,194 B2
(45) Date of Patent: Jan. 26, 2021

(54) MICRO LIGHT-EMITTING DIODE DISPLAY WITH 3D ORIFICE PLATING AND LIGHT FILTERING

(71) Applicant: Hewlett-Packard Development Company, L.P., Spring, TX (US)

(72) Inventors: Ning Ge, Palo Alto, CA (US); Ya Ling Chang, Palo Alto, CA (US); Helen A. Holder, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/472,925

(22) PCT Filed: Apr. 24, 2017

(86) PCT No.: PCT/US2017/029177
§ 371 (c)(1),
(2) Date: Jun. 24, 2019

(87) PCT Pub. No.: WO2018/199901
PCT Pub. Date: Nov. 1, 2018

(65) Prior Publication Data
US 2020/0043902 A1  Feb. 6, 2020

(51) Int. Cl.
*H01L 25/07* (2006.01)
*H01L 33/50* (2010.01)
(Continued)

(52) U.S. Cl.
CPC ........ *H01L 25/0753* (2013.01); *H01L 33/507* (2013.01); *G02B 19/0066* (2013.01);
(Continued)

(58) Field of Classification Search
CPC ............. H01L 25/0753; H01L 33/507; G02B 19/0066; G03G 2215/0409; G03G 2215/0453; H04N 1/0288; H04N 1/02845
See application file for complete search history.

(56) References Cited

U.S. PATENT DOCUMENTS 6,960,776 B2 * 11/2005 Machi .................... F21V 29/00
250/504 R
7,700,967 B2   4/2010 Zhang et al.
(Continued)

FOREIGN PATENT DOCUMENTS

CN          201156374       11/2008
JP          2006190851 A     7/2006
(Continued)

OTHER PUBLICATIONS

An introduction to MicroLED; a new self-emitting display technology < http://www.avsforum.com/forum/166-lcd-flat-panel-displays/26354, Feb. 2016, 3-introduction-microled-new-self-emitting-display-technology.html >.

*Primary Examiner* — Ida M Soward
(74) *Attorney, Agent, or Firm* — Rahman LLC

(57) ABSTRACT

A micro light-emitting diode (LED) display assembly includes a backplane, a passivation layer on the backplane, a micro LED on the passivation layer, and a non-transparent metal housing on the passivation layer. The housing includes a base portion on the passivation layer, a sidewall portion upwardly extending from the base portion, a cap portion connected at a top of the sidewall portion, an orifice in the cap portion, and a notch in the cap portion and adjacent to the orifice. The assembly also includes a translucent filter positioned in the notch and covering the orifice, and a pocket defined by an enclosed area in between the sidewall portion, the cap portion, the filter, and the passivation layer. The
(Continued)

micro LED is encased within the pocket such that light transmitted from the micro LED directly hits and passes through the filter.

11 Claims, 10 Drawing Sheets

(51) Int. Cl.
*H04N 1/028* (2006.01)
*H01L 25/075* (2006.01)
*G02B 19/00* (2006.01)

(52) U.S. Cl.
CPC .............. *G03G 2215/0409* (2013.01); *G03G 2215/0453* (2013.01); *H01L 2933/005* (2013.01); *H01L 2933/0041* (2013.01); *H04N 1/0288* (2013.01); *H04N 1/02845* (2013.01)

(56) References Cited

U.S. PATENT DOCUMENTS

| | | | |
|---|---|---|---|
| 7,722,220 B2* | 5/2010 | Van De Ven | F21S 8/026 362/294 |
| 8,104,923 B2* | 1/2012 | Nagai | H01L 25/0753 362/240 |
| 8,475,057 B2* | 7/2013 | Kihara | G02B 6/4201 385/93 |
| 8,928,021 B1 | 1/2015 | Bibl et al. | |
| 9,276,175 B2 | 3/2016 | Park et al. | |
| 9,437,782 B2 | 9/2016 | Bower et al. | |
| 9,525,093 B2* | 12/2016 | Costello | G01S 7/4813 |
| 9,557,954 B2 | 1/2017 | Jepsen et al. | |
| 10,797,188 B2* | 10/2020 | Chu | H01L 24/97 |
| 2001/0045573 A1* | 11/2001 | Waitl | H01L 25/0753 257/205 |
| 2004/0120155 A1* | 6/2004 | Suenaga | H01L 33/642 362/362 |
| 2009/0242915 A1* | 10/2009 | Chang Chien | H01L 33/507 257/98 |
| 2012/0327649 A1* | 12/2012 | Harbers | F21K 9/64 362/230 |
| 2015/0318328 A1 | 11/2015 | Bibl et al. | |
| 2018/0323352 A1* | 11/2018 | Takano | H01L 33/502 |

FOREIGN PATENT DOCUMENTS

| | | |
|---|---|---|
| WO | WO-2015193434 A2 | 12/2015 |
| WO | WO-2016060676 A1 | 4/2016 |
| WO | WO-16079505 | 5/2016 |

* cited by examiner

MICRO LIGHT-EMITTING DIODE DISPLAY WITH 3D ORIFICE PLATING AND LIGHT FILTERING

BACKGROUND

Micro light-emitting diode (μLED) display technology is considered as a promising display technology after organic light-emitting diode (OLED) display technology. Micro LED display technology makes use of pixels mounted on each micro LED with the micro LEDs as the pixel light source.

DETAILED DESCRIPTION

The examples described herein provide a technique for light concentration and filtering for light emitted from a micro LED source for use in a pixel display. A red, green, blue (RGB) filter is provided with an electroplated metal housing, which avoids light interference with other LEDs, as described in accordance with the examples herein. The electroplating process utilized for constructing the metal housing offers a low-cost manufacturing technique, and the structural characteristics of the metal housing provide for improved use and handling during the manufacturing and installation processes. The resulting assembly provided by the examples herein is easily implemented in a pixel configuration.

Figure 1:
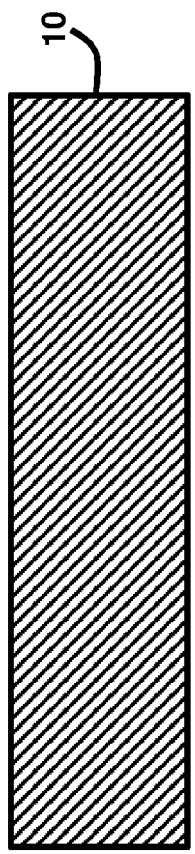
FIG. 1 is a cross-sectional view illustrating a schematic diagram of a manufacturing process, according to a first example herein.
Figure 2:
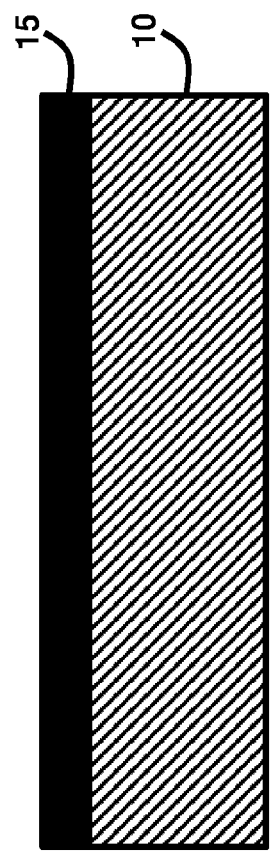
FIG. 2 is a cross-sectional view illustrating a schematic diagram of a manufacturing process, according to a second example herein.
Figure 3:
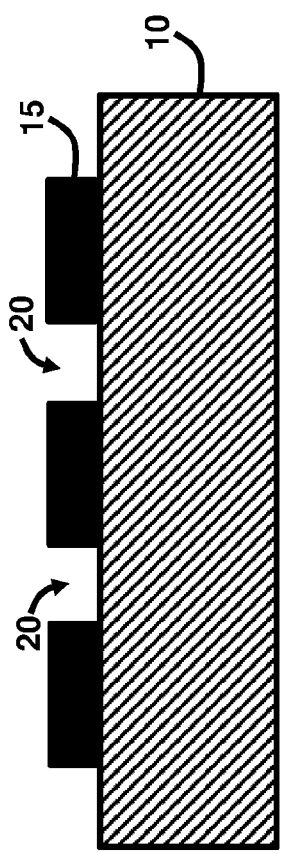
FIG. 3 is a cross-sectional view illustrating a schematic diagram of a manufacturing process, according to a third example herein.

FIGS. 1 through 9 are cross-sectional views illustrating schematic diagrams of a manufacturing sequence, according to various examples described herein. As shown in FIG. 1, a mandrel 10 may be provided. The mandrel 10 may be formed of glass, soda-lime-silica glass, or another wafer material onto which a metal may be sputtered or otherwise formed by electroplating, as described in greater detail below. The mandrel 10, which may be reusable, may include a conducting and non-conducting region for the electroplating or for electroless plating. In FIG. 2, a masking material 15 comprising silicon oxide, for example, may be applied over the mandrel 10. The masking material 15 may include either a positive or negative photoresist material, or may be a hard mask, for example. Moreover, the masking material 15 may include any of a photopolymeric, photodecomposing, or photocrosslinking photoresist. FIG. 3 illustrates a patterning process whereby the masking material 15 may be patterned to form recessed areas 20 that expose the underlying mandrel 10 using typical lithography techniques.

Figure 4:
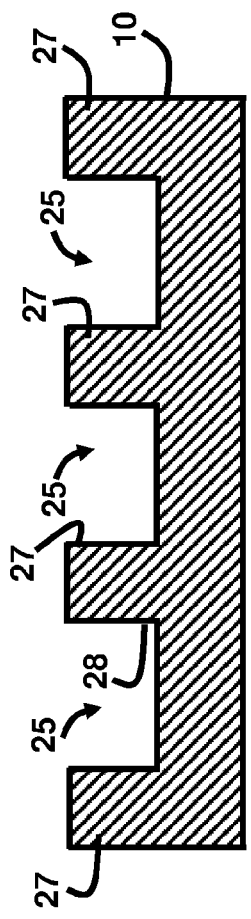
FIG. 4 is a cross-sectional view illustrating a schematic diagram of a manufacturing process, according to a fourth example herein.

In FIG. 4, an etching process may occur to form deep recesses 25 and subsequently elongated formations 27 in the mandrel 10. The deep recesses 25 may be configured as 5 μm deep recesses 25, in one example. The etching process may involve a wet etch technique using hydrofluoric acid (HF), phosphoric acid, acetic acid, nitric acid, or other suitable wet etchant. If necessary, the etching process may involve using slightly heated wet etchants. Alternatively, a dry etching process may be used; for example, using reactive-ion etching with a plasma of reactive gases. The wet etching process may etch the mandrel 10 isotropically, although if potassium hydroxide (KOH) or tetramethylammonium hydroxide (TMAH) etchant solutions are used, then the wet etching process can etch the mandrel 10 anisotropically. In one example, mandrel 10 may be immersed in 25% TMAH solution at 95° C. to perform the wet etching process. The dry etching process will typically etch the mandrel 10 directionally or anisotropically. In one example, the masking material 15 may be removed by a dry etching process followed by a cleaning process. For the purposes of illustration only, the elongated formations and resulting structures shown in the figures and described herein are vertically straight. However, the elongated formations 27 may have tapered, curved, angled, or any other desired shape sidewalls 28. Once the etching process is completed, the masking material 15 is completely removed. If desired, a subsequent etching process may occur to further refine the desired shapes of the deep recesses 25 and corresponding elongated formations 27. The subsequent etching process may include either a wet or dry etching process as described above.

Figure 5:
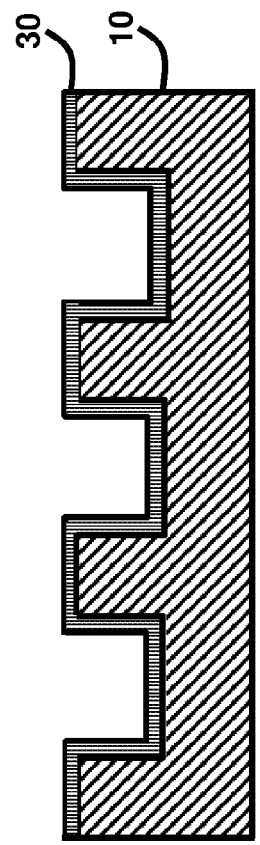
FIG. 5 is a cross-sectional view illustrating a schematic diagram of a manufacturing process, according to a fifth example herein.

FIG. 5 depicts a metal deposition process whereby a metal layer 30 comprising chrome, stainless steel, copper, or tantalum, etc., for example, is deposited over the mandrel 10 including the deep recesses 25 and elongated formations 27. Any suitable deposition technique may be utilized, such as, for example sputtering, evaporation, pulse laser, and electron beam, among others. Metal layer 30 acts as a mask for the mandrel 10 upon which a resulting electroplating process may occur.

Figure 6:
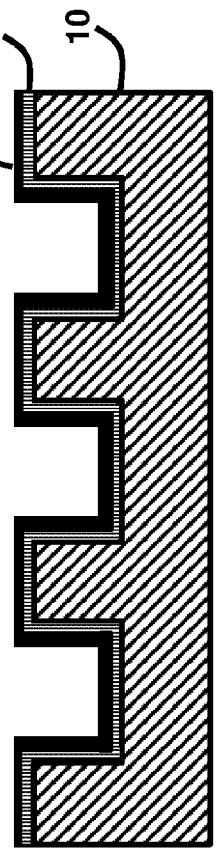
FIG. 6 is a cross-sectional view illustrating a schematic diagram of a manufacturing process, according to a sixth example herein.
Figure 7:
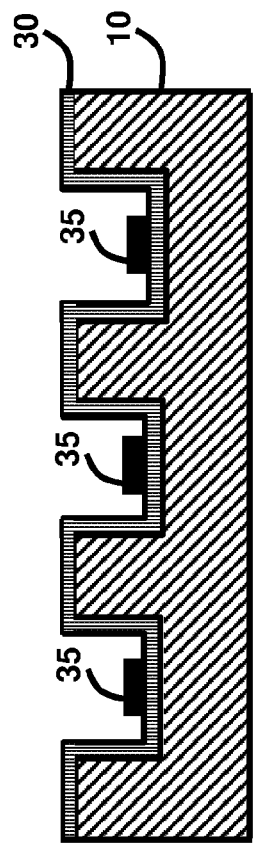
FIG. 7 is a cross-sectional view illustrating a schematic diagram of a manufacturing process, according to a seventh example herein.

In FIG. 6, a masking material 35 may be deposited over metal layer 30. The masking material 35 may include silicon oxide, silicon carbide, silicon nitride, or other type of non-conductive material, and may be deposited by plasma-enhanced chemical vapor deposition (PECVD), for example. In FIG. 7, the masking material 35 may be selectively patterned to provide for an area that will eventually be a hole, aperture, bore, orifice, or other type of material void.

Figure 8:
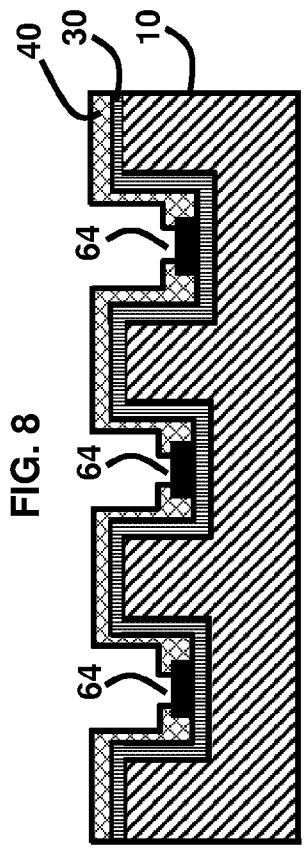
FIG. 8 is a cross-sectional view illustrating a schematic diagram of a manufacturing process, according to an eighth example herein.

FIG. 8 illustrates an electroplating process whereby a metal layer 40 may be formed over metal layer 30 and portions of the patterned masking material 35. The electroplating process may involve immersing the masking material 35 into a plating bath resulting in the metal layer 30 being plated by metal layer 40 except over the areas occupied by the non-conductive masking material 35. In various examples, the plating bath may comprise any of gold, nickel, nickel sulfamate, palladium, platinum, rhodium, titanium, or other suitable plating bath material. Brighteners and anti-pitting agents such as benzene sulfonic acid, formaldehyde chloral hydrate, and sodium lauryl sulfate may also be utilized. In this regard, the electroplating process is highly scalable in that various types of materials can be plated on different thicknesses; e.g., <0.1 µm to 100 µm, for example, on different topographies. The electroplating process control is well controlled given the thicknesses described above and for feature sizes of approximately 0.1 µm. In an example, an additive free Watts nickel bath may be utilized for the electroplating process. The Watts nickel bath may contain 240 g $L^{-1}$ nickel sulfate ($NiSO_4.6H_2O$), 30 g $L^{-1}$ nickel chloride ($NiCl_2.6H_2O$), and 30 g $L^{-1}$ boric acid ($H_3BO_3$), and have a pH of 4.5. The plating temperature may be selected to be approximately 40° C. in order to reduce the internal stress in the metal layer 30 during the electroplating process. A pulsed potential deposition may be used to generate the electroplated metal layer 40. As an example, the pulse characteristics may include an on-time of 100 ms, an off-time of 900 ms, an applied based potential of 0.6 V, and a peak potential of 1.35 V.

Figure 9:
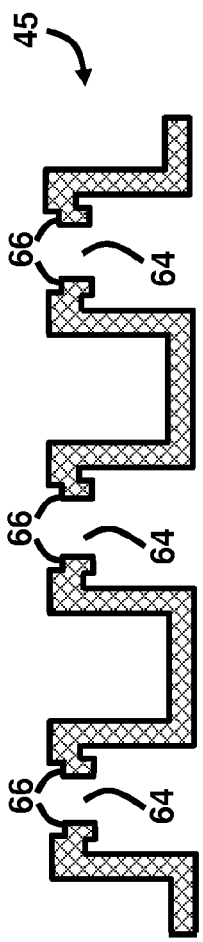
FIG. 9 is a cross-sectional view illustrating a schematic diagram of a manufacturing process, according to a ninth example herein.

The electroplated metal layer 40 shall become the eventual desired 3D metal housing structure 45 of the manufacturing process, as illustrated in FIG. 9. Here, the structure 45 is shown flipped over after the electroplated metal layer 40 including mandrel 10 and metal layer 30 are removed from the plating bath and the remaining masking material 35 is removed. The resulting peel-off of the masking material 35 reveals an orifice 64 in the housing 45. The orifice 64 is defined by a notch 66 on the sides of the orifice 64. In one example, the orifice 64 may have a cylindrical shape such that the notch 66 is also cylindrically shaped. Other shapes are also possible in accordance with other examples. The size of the orifice 64 including the width and thickness may be selected to accommodate a structure the size of a quantum dot; e.g., approximately 2 to 10 nanometers. Multiple orifices 64 and corresponding notches 66 may be formed in the housing 45.

Figure 10:
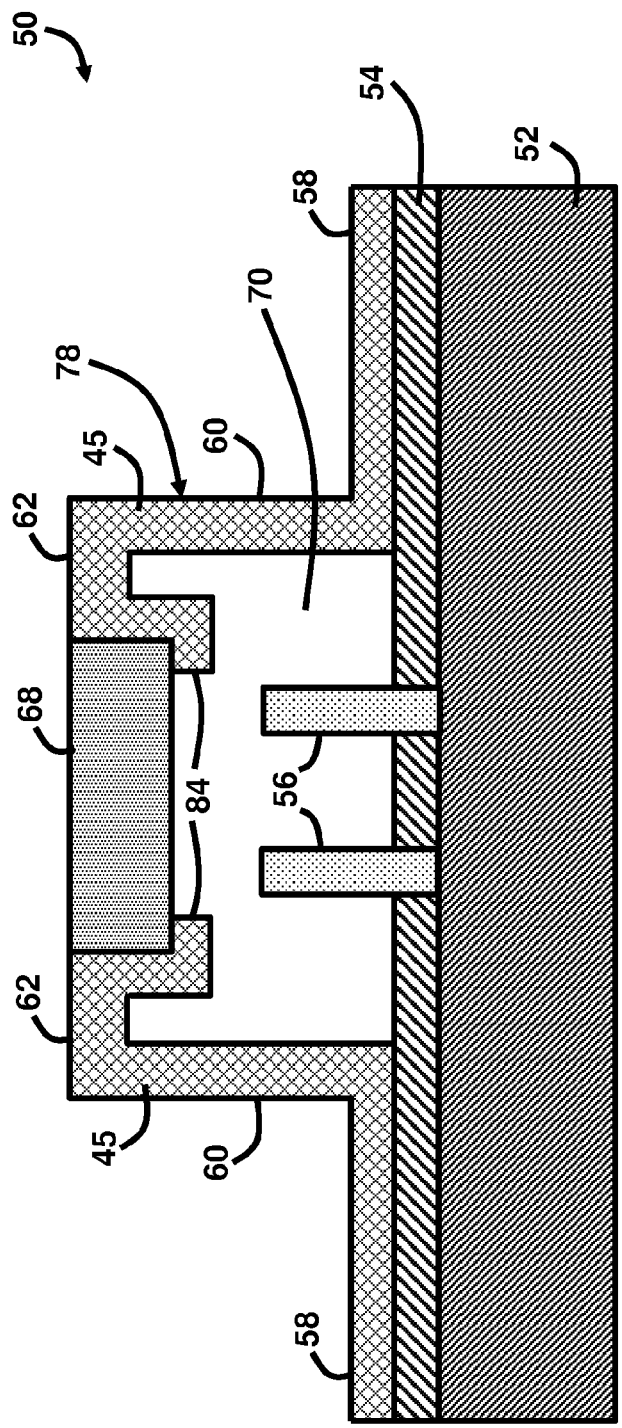
FIG. 10 is a cross-sectional view illustrating a schematic diagram of a three-dimensional (3D) micro LED display assembly, according to an example herein.

FIG. 10, with reference to FIGS. 1 through 9, illustrate an implementation of the housing 45 in a micro LED display assembly 50, according to an example herein. The assembly 50 may comprise a backplane or substrate 52 with electrical circuitry, a passivation layer 54 on the backplane or substrate 52, a micro LED 56 on the passivation layer 54, and the non-transparent metal housing 45 on the passivation layer 54. The substrate 52 may be rigid or flexible and may comprise any of sapphire, silicon carbide, silicon, and gallium nitride materials, for example. The substrate 52 is configured to hold and drive the micro LED 56. The passivation layer 54, which may help reduce current leakage in the assembly 50, may comprise any of silicon dioxide, silicon nitride, aluminum oxide, and combinations of these, among other materials. The housing 45 comprises a bottom base portion 58 adjacent to and positioned on the passivation layer 54, a sidewall portion 60 upwardly extending from the bottom base portion 58, and a cap portion 62 connected at a top of the sidewall portion 60. As shown in the drawings, the sidewall portion 60 is perpendicular to the base portion 58 and the cap portion 62. In other examples, the sidewall portion may be angled, curved, or assume any desired shape. The base portion 58 and the cap portion 62 may be parallel to one another. In one example, the sidewall portion 60 and cap portion 62 form a cylindrically shaped capsule component 78.

The orifice 64 is located in the cap portion 62 of the housing 45 along with the notch 66 in the cap portion 62 and adjacent to the orifice 64. A translucent filter 68 is positioned in the notch 66 and covers the orifice 64. The ends of the notch 66 form a holder 84 to allow the filter 68 to securely rest in the notch 66 and over the orifice 64. The filter 68 may comprise a quantum dot, in one example. The assembly 50 includes a pocket 70 defined by an enclosed area in between the sidewall portion 60, the cap portion 62, the filter 68, and the passivation layer 54, wherein the micro LED 56 is encased within the pocket 70 such that light 72 transmitted from the micro LED 56 directly hits and passes through the filter 68 without any intervening layer or structure, such as a wavelength matching layer or structure, therebetween. Other than the passivation layer 54, LED 56, housing 45, and filter 68 there are no other structures contacting the pocket 70. Accordingly, the housing 45 and filter 68 are the only structures facing the LED 56, and correspondingly, the passivation layer 54 may directly face the cap portion 62 and the filter 68 in the pocket 70. Because the housing 45 is a non-transparent, metal housing 45, no light refracts or otherwise penetrates the housing 45. Only light is able to be transmitted through the translucent filter 68 in the assembly 50. In some examples, the assembly 50 may include a plurality of micro LEDs 56; e.g., two or more micro LEDs 56, on the passivation layer 54 and encased within the pocket 70. In one example, the micro LED 56 may comprise a mono color micro LED 56.

Figure 11:
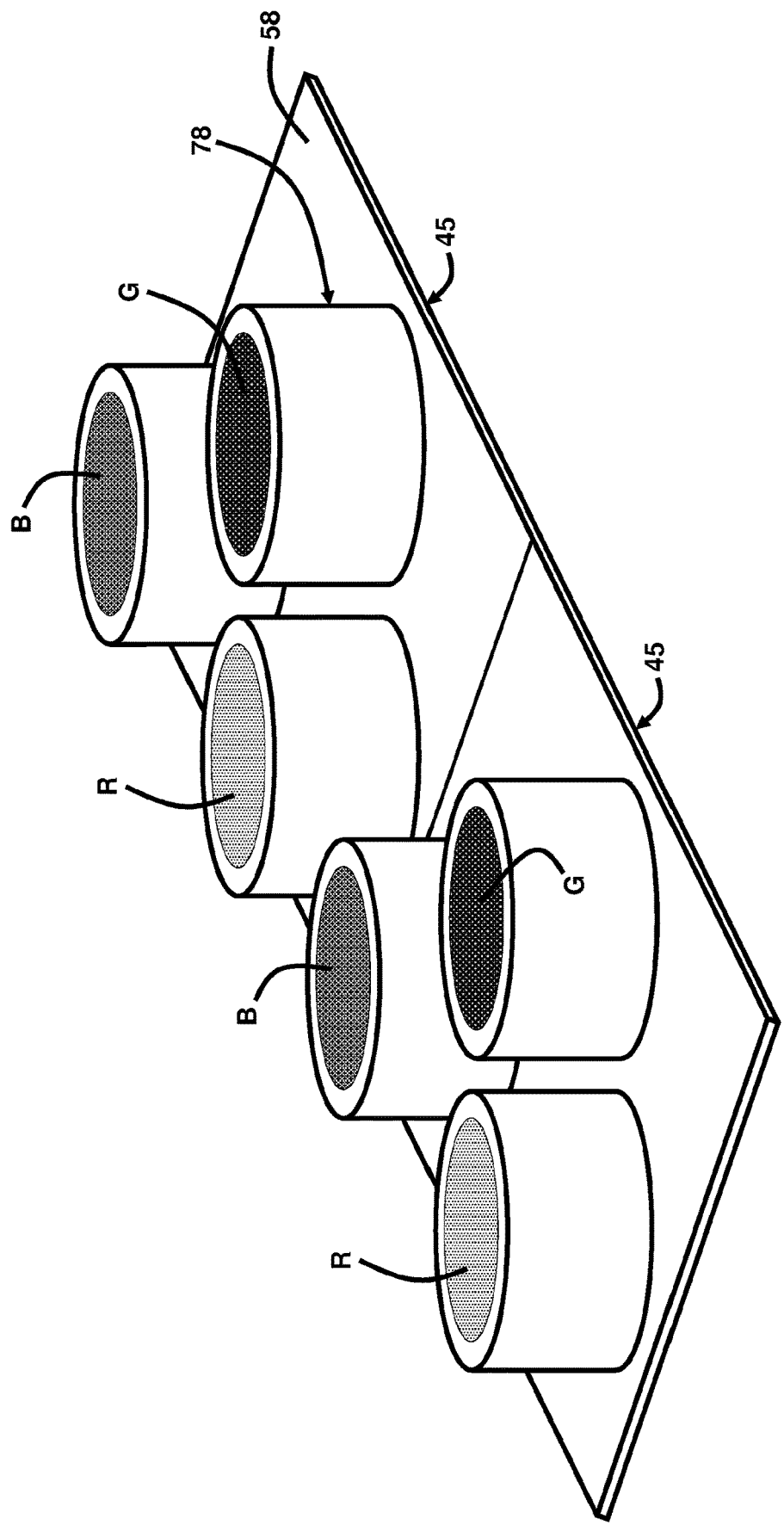
FIG. 11 is a perspective view illustrating a schematic diagram of a pair of 3D orifice housings with filters, according to an example herein.

The translucent filter 68 may comprise a translucent colored filter 68 corresponding to red (R), green (G), and blue (B) colors. As used herein and illustrated in the figures, filter 68 and R, G, B are used and described interchangeably. FIG. 11, with reference to FIGS. 9 and 10, is a perspective view illustrating a schematic diagram of a pair of 3D orifice housings 45 with R, G, B filters, according to an example herein. As shown, the capsules 78 are depicted as substantially cylindrical structures, although other shapes and configurations are possible. The outwardly protruding cylindrical capsules 78 in relation to the flat underlying base portion 58 provides the 3D configuration associated with the housing 45.

Figure 12:
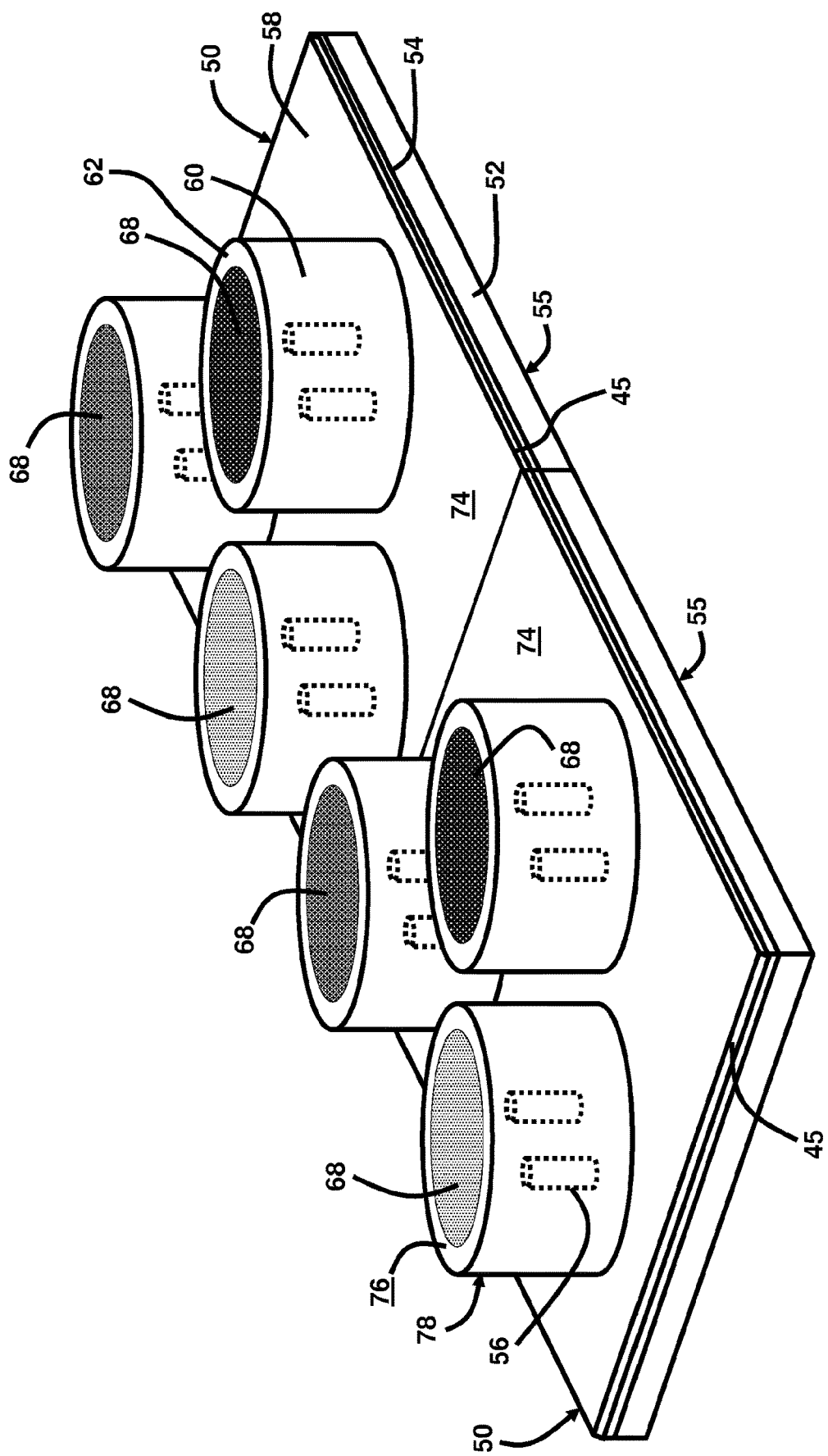
FIG. 12 is a top perspective view illustrating a schematic diagram of a pair of 3D micro LED display assemblies arranged as pixel squares, according to an example herein.

FIG. 12, with reference to FIGS. 9 through 11, is a perspective view illustrating a schematic diagram of a pair of 3D micro LED display assemblies 50 arranged as pixel squares 55, according to an example herein. Because the capsules 78, which comprise the sidewall portion 60 and cap portion 62 of the metal housing 45, are electroplated and non-transparent, the LEDs 56 contained within the capsules 78 would not be viewable except to the extent LEDs 56 are viewable through the translucent filters 68. For the purposes of illustration in FIG. 12, the LEDs 56 are represented in dotted/phantom lines to represent the opaqueness of the capsules 78. As further shown in FIG. 12, the bottom base portion 58 is a continuous structure connecting to a plurality of separate capsules 78; e.g., three, for example, on each pixel square 55. Each bottom base portion 58 is positioned on the passivation layer 54 and underlying substrate 52. Each of the bottom base portion 58 and the cap portion 62 may comprise a planar upper surface 74, 76, respectively. In this regard, in an example, neither the base portion 58 nor the cap portion 62 has a curved upper surface as defined in relation to the planar surfaces 74, 76 having any upwardly definable shape projecting from the upper surfaces 74, 76, respectively. More particularly, the upper surface 74 of the base portion 58 may be parallel to the upper surface 76 of the cap portion. This configuration permits the RGB filters 68 to be positioned parallel to the base portion 58 also, which further allows the RGB filters 68 to be positioned parallel with respect to the LEDs 56.

Figure 13:
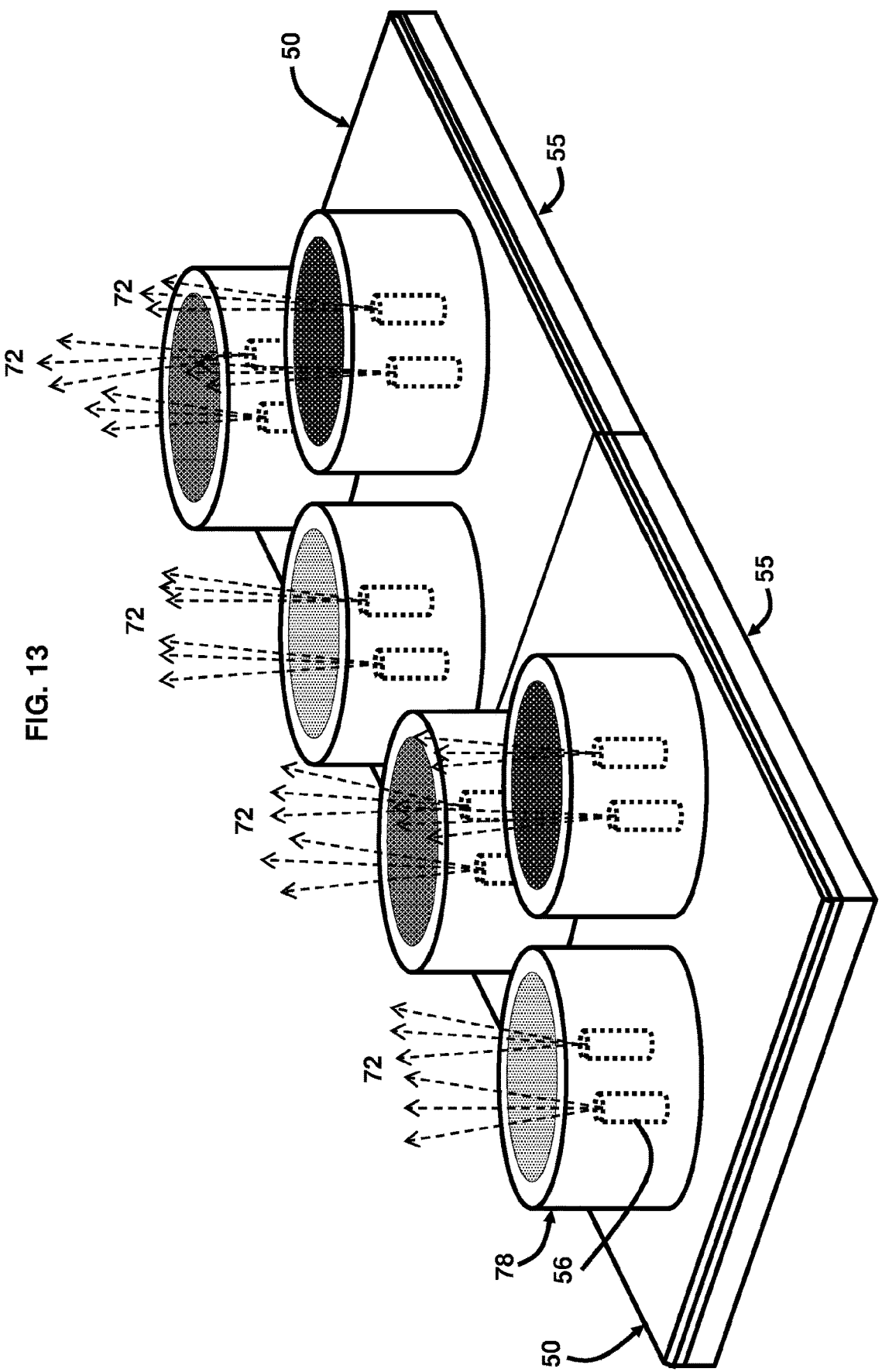
FIG. 13 is a perspective view illustrating a schematic diagram of a pair of 3D micro LED display assemblies containing micro LEDs with light emanating from the micro LEDs, according to an example herein.

FIG. 13, with reference to FIGS. 9 through 12, is a perspective view illustrating a schematic diagram of a pair of 3D micro LED display assemblies 50 containing micro LEDs 56 with light 72 emanating from the micro LEDs 56, according to an example herein. For the purposes of illustration in FIG. 13, the LEDs 56 are represented in dotted/phantom lines to represent the opaqueness of the capsules 78. The assemblies 50 are arranged as pixel squares 55. The configuration where the RGB filters 56 are positioned parallel to the micro LEDs 56 permits the RGB filters 68 to convert and concentrate the light 72 coming from the micro LEDs 56 in a much more direct manner than if the light 72 was significantly angled coming out of the filter 68 or if it became refracted by the housing 45. However, the metal, non-translucent nature of the housing 45 prevents such refraction from occurring. Furthermore, each pixel square 55 may comprise multiple capsules 78; e.g., three capsules 78 including one for each color filter 68. By using mono color micro LEDs 56, the capsules 78 are able to generate any suitable color combination based on the color combination of the filters 68 on any given pixel square 55. While the drawings depict a red, green, blue filter 68 on each pixel square 55, this is for illustration purposes only, and each pixel square 55 may be configured in any combination of the RGB filters 68 in order to block light 72 or permit light 72 from passing through the filters 68. For example, using a red filter R blocks all colors other than red from passing through the filter 68 and being displayed. Similarly, using a green filter G blocks all colors other than green from passing through the filter 68 and being displayed. Likewise, using a blue filter B blocks all colors other than blue from passing through the filter 68 and being displayed. The micro LEDs 56 may generate white light, in one example. In other configurations, the micro LEDs 56 may generate other colors of light, including red, green, and blue. However, the specific red, green, and blue filters 68 may suitably convert the light into a color commensurate with the color of the filter 68.

Figure 14:
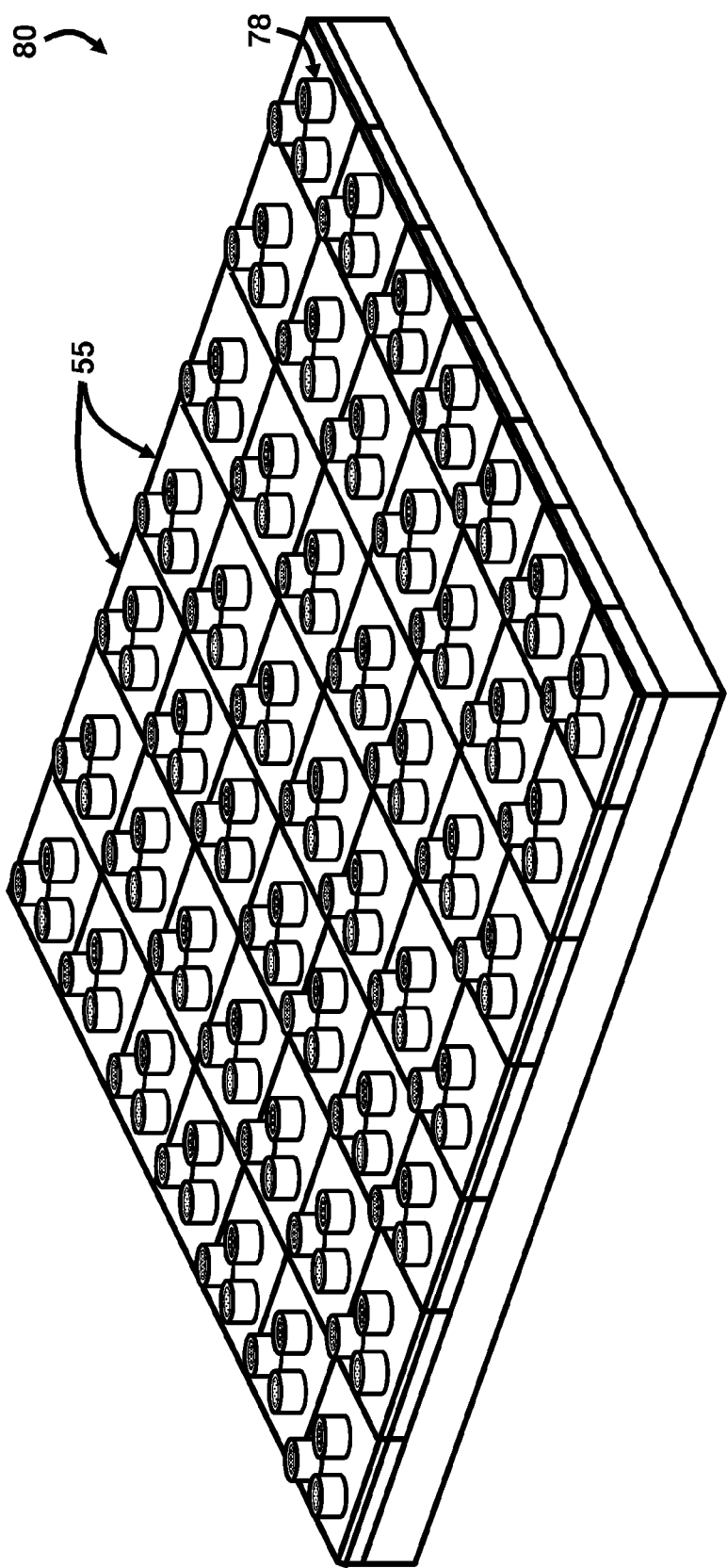
FIG. 14 is a perspective view illustrating a schematic diagram of a pixel array, according to an example herein.

FIG. 14, with reference to FIGS. 9 through 13, is a perspective view illustrating a schematic diagram of a pixel array 80, according to an example herein. The micro LED pixel array 80 comprises a conductive plate configured as a housing 45 and comprising a bottom portion 58, a plurality of conductive capsules 78 spaced apart from one another and outwardly protruding from the bottom portion 58, wherein each capsule 78 of the plurality of conductive capsules 78 comprises a hollow pocket 70 as described above with reference to FIG. 10. A plurality of capsules 78; e.g., three, in one example, are arranged in one pixel square 55. The pixel array 80 comprises multiple pixel squares 55. An orifice 64 is at the top; i.e., cap 62 of each capsule 78, and a color conversion filter 68 is positioned in the top; i.e., cap 62 of each capsule 78 and covering the orifice 64, wherein the color conversion filter 68 directly contacts the hollow pocket 70 of each capsule 78 as described above with reference to FIG. 10. The holder 84, which may be conductive, is in the top; i.e., cap 62 of each capsule 78 and retains the color conversion filter 68 over the orifice 64. The holder 84 may define the size and shape of the notch 66. In one example, the entire plate; e.g., housing 45, including the base portion 58 and capsule 78 are electrically conductive. At least one micro LED 56 may be positioned in each capsule 78. The conductive plate; e.g., housing 45, and the plurality of conductive capsules 78 may comprise a continuous electroplated structure such that the bottom base portion 58 provides a continuous base portion 58 for all capsules 78 arranged in a particular pixel square 55. The conductive plate; e.g., housing 45, and the plurality of conductive capsules 78 may be opaque, in one example.

Figure 15A:
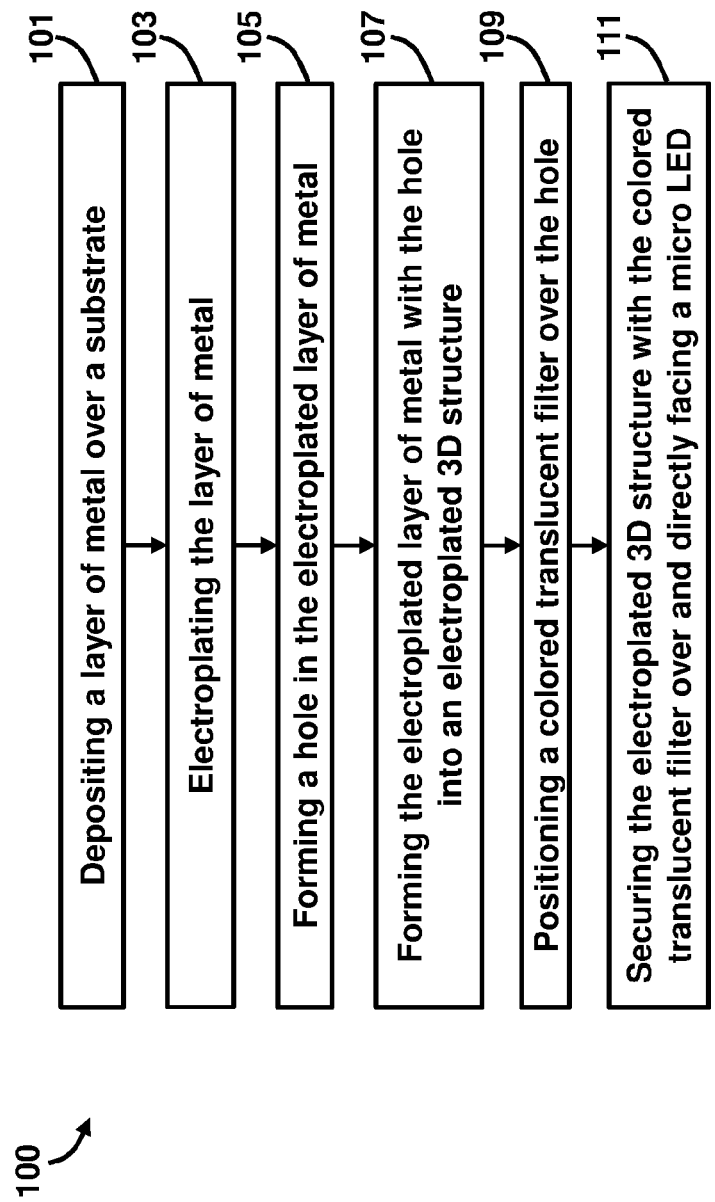
FIG. 15A is a flowchart illustrating a method, according to an example herein.
Figure 15B:
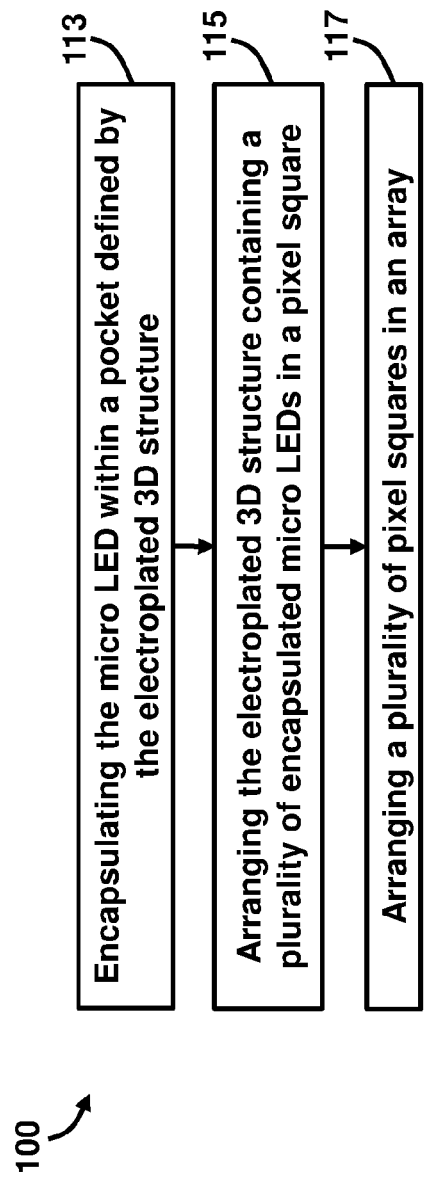
FIG. 15B is another flowchart illustrating a method, according to an example herein.

FIGS. 15A and 15B, with reference to FIGS. 1 through 14, are flowcharts illustrating a method 100, according to an example. The method 100 may not necessarily coincide with the specific manufacturing processes provided in FIGS. 1 through 10, but rather the method 100 may refer to an installation method or alternate manufacturing method apart from the manufacturing processes of FIGS. 1 through 10. In FIG. 15A, block 101 provides depositing a layer of metal 30 over a substrate 10. Block 103 provides electroplating the layer of metal 30. In an example, the layer of metal 30 is electroplated by immersing the layer of metal 30 into a plating bath causing a layer of metal 40 to be electroplated over the layer of metal 30. Block 105 provides forming a hole 64 in the electroplated layer of metal 30/40. Block 107 provides forming the electroplated layer of metal 30/40 with the hole 64 into an electroplated 3D structure; e.g., into housing 45. This may occur, for example, using a peel-off process resulting in the housing 45 being released from a substrate 10. Due to previous patterning of the substrate 10 and any other layers of materials above the substrate 10 and below the layer of metal 40; for example, layer of metal 30 and masking material 35, the resulting housing 45 becomes a 3D structure as opposed to just a flat sheet structure. Block 109 provides positioning a colored translucent filter 68 over the hole 64. The filter 68 may be snap fit, for example into a notch 66 surrounding the hole 64, and may be secured into place by a holder 84. Alternatively, the filter may be held in place using an adhesive or by heating/melting or some form of shrink-fitting of the filter 68 into place over the hole 64. Block 111 provides securing the electroplated 3D structure 45 with the colored translucent filter 68 over and directly facing a micro LED 56. In this regard, there is no intervening structure in an area in between the holders 84 of the filter and the micro LED 56 such that the light 72 may pass directly through the filter 68 from the micro LED 56 without first going through another structure such as a wavelength matching layer.

FIG. 15B illustrates block 113 that provides that the method 100 may comprise encapsulating the micro LED 56 within a pocket 70 defined by the electroplated 3D structure 45. The pocket 70 is defined by the space bounded by the housing 45, filter 68 and the passivation layer 54. Block 115 provides that the method 100 may comprise arranging the electroplated 3D structure; e.g., housing 45 containing a plurality of encapsulated micro LEDs 56 in a pixel square 55. The pixel square 55 may include three capsules 78 having a continuous bottom base portion 58 connected to all three capsules 78 such that the three capsules 78 correspond to each one of a red, green, and blue-colored filter; RGB filter 68. Block 117 provides that the method 100 may comprise arranging a plurality of pixel squares 55 in an array 80. The array 80 may be suitable for use in a wide variety of applications including television screens/displays, computer/tablet monitors, and smartphone displays; or any other type of display using micro LEDs 56 as a pixel light source.

The examples described herein provide a micro LED display assembly 50 that provides for on-packaging components for light concentration, conversion, and filtering. Using the micro LED 56 for each dot; e.g., sub-pixel, with the 3D orifice housing 45 allows for the assembly 50 to display any color combination created by the RGB filters 68. Because the housing 45 is metal and non-transparent or non-translucent, the light 72 does not leave the capsules 78 except through the filters 68, which is positioned at the very top; e.g., cap portion 62, of the capsules 78. Moreover, due to the planar configuration of the upper surfaces 74, 76 of each of the base portion 58 and the cap portion 62, respectively, the light 72 that leaves the filter 68 is concentrated in a substantially upward direction, rather than a significantly angled or lateral direction. This concentrated direction of the light 72 avoids light interference that would ordinarily occur if light were allowed to escape from a translucent capsule.

The present disclosure has been shown and described with reference to the foregoing exemplary implementations. Although specific examples have been illustrated and described herein it is manifestly intended that the scope of the claimed subject matter be limited only by the following claims and equivalents thereof. It is to be understood, however, that other forms, details, and examples may be made without departing from the spirit and scope of the disclosure that is defined in the following claims.

What is claimed is:

1. A micro light-emitting diode (LED) display assembly comprising:
   a backplane;
   a passivation layer on the backplane;
   a micro LED on the passivation layer;
   a non-transparent metal housing on the passivation layer, wherein the housing comprises:
      a base portion on the passivation layer;
      a sidewall portion upwardly extending from the base portion;
      a cap portion connected at a top of the sidewall portion; and
      an orifice in the cap portion;
   a translucent filter positioned in the notch and covering the orifice; and
   a pocket defined by an enclosed area in between the sidewall portion, the cap portion, the filter, and the passivation layer, wherein the micro LED is encased within the pocket such that light transmitted from the micro LED directly hits and passes through the filter.

2. The assembly of claim 1, comprising a plurality of micro LEDs on the passivation layer and encased within the pocket.

3. The assembly of claim 1, wherein the translucent filter comprises a translucent colored filter.

4. The assembly of claim 1, wherein the passivation layer directly faces the cap portion and the filter in the pocket.

5. The assembly of claim 1, wherein each of the base portion and the cap portion comprise a planar upper surface.

6. The assembly of claim 1, wherein the micro LED comprises a mono color micro LED.

7. A micro light-emitting diode (LED) pixel array comprising:
   a conductive plate comprising a bottom portion;
   a plurality of conductive capsules spaced apart from one another and outwardly protruding from the bottom portion, wherein each capsule of the plurality of conductive capsules comprises a hollow pocket;
   an orifice at the top of each capsule; and
   a color conversion filter positioned in the top of each capsule and covering the orifice, wherein the color conversion filter directly contacts the hollow pocket of each capsule.

8. The array of claim 7, comprising a conductive holder in the top of each capsule and retaining the color conversion filter over the orifice.

9. The array of claim 7, comprising at least one micro LED positioned in each capsule.

10. The array of claim 7, wherein the conductive plate and the plurality of conductive capsules comprise a continuous electroplated structure.

11. The array of claim 7, wherein the conductive plate and the plurality of conductive capsules are opaque.

* * * * *